(12) United States Patent
Lee

(10) Patent No.: US 7,826,024 B2
(45) Date of Patent: Nov. 2, 2010

(54) LCD MODULE AND LIQUID CRYSTAL IMAGING MEANS USING THE SAME

(75) Inventor: Young-Min Lee, Yongin-si (KR)

(73) Assignee: Samsung Electronics Co., Ltd., Maetan-Dong, Yeongtong-Gu, Suwon-Si, Gyeonggi-Do (KR)

( * ) Notice: Subject to any disclaimer, the term of this patent is extended or adjusted under 35 U.S.C. 154(b) by 123 days.

(21) Appl. No.: 11/939,607

(22) Filed: Nov. 14, 2007

(65) Prior Publication Data

US 2008/0123017 A1  May 29, 2008

(30) Foreign Application Priority Data

Nov. 24, 2006  (KR) .................. 10-2006-0116894

(51) Int. Cl.
  *G02F 1/1345* (2006.01)
  *G02F 1/1333* (2006.01)
(52) U.S. Cl. .................. 349/149; 349/58; 349/150
(58) Field of Classification Search .................. 349/149
See application file for complete search history.

(56) References Cited

U.S. PATENT DOCUMENTS 6,191,838 B1 * 2/2001 Muramatsu .................. 349/149
6,462,780 B1 * 10/2002 Stephany et al. ............ 348/372
6,523,966 B1 * 2/2003 Satoh et al. .................. 362/601
6,957,986 B2 * 10/2005 Jing ............................ 439/700
2002/0024802 A1 * 2/2002 Chikawa et al. ............. 361/809
2002/0085158 A1 * 7/2002 Armagost et al. ........... 349/149

FOREIGN PATENT DOCUMENTS

KR  2003-40839  5/2003
KR  2003-54763  7/2003

* cited by examiner

*Primary Examiner*—David Nelms
*Assistant Examiner*—W. Patty Chen
(74) *Attorney, Agent, or Firm*—Cha & Reiter, LLC

(57) ABSTRACT

Disclosed is an LCD module and a liquid crystal imaging means using the same. The LCD module includes an LCD panel, a circuit board on which the LCD panel is mounted, and a plurality of pogo pins electrically connected to the circuit board. The liquid crystal imaging means include an LCD module having a circuit board, an LCD panel seated on the circuit board, and a plurality of pogo pins electrically connected to the circuit board; and a main board having a plurality of contact members corresponding to the pogo pins so that the pogo pins are connected to respective contact members.

4 Claims, 2 Drawing Sheets

LCD MODULE AND LIQUID CRYSTAL IMAGING MEANS USING THE SAME

CLAIM OF PRIORITY

This application claims priority to application entitled "LCD Module and Liquid Crystal Imaging Means Using the Same" filed with the Korean Intellectual Property Office on Nov. 24, 2006 and assigned Ser. No. 2006-116894, the contents of which are incorporated herein by reference.

BACKGROUND OF THE INVENTION

1. Field of the Invention

The present invention relates to a portable terminal, and more particularly to a portable terminal having an LCD module.

2. Description of the Related Art

As generally known in the art, portable terminals incorporating various functions may also be regarded as a liquid crystal imaging means having an LCD module for providing users with visual information. The LCD module may include an LCD panel and a circuit board having circuits for driving and controlling the LCD panel integrated thereon.

FIG. 1 shows a simple construction of a conventional liquid crystal imaging means 100 having an LCD module and a main board connected to it. Referring to FIG. 1, the LCD module 120 is electrically connected to the main board 110 via cables 125. Connectors 130 are formed at the junction between the cables 125 and the main board 110 so as to electrically connect the LCD module 120 to the main board 110. The main board 110 further has electrical devices and circuits integrated thereon so as to implement major functions of the liquid imaging means 100. In operation, the main board 110 provides and controls data when connected to the LCD module 120.

A conventional LCD module 120 may include an LCD panel and a flexible circuit board or a rigid board for mounting the LCD panel. Particularly, a driver for driving the LCD panel, a power supply terminal for supplying power, and terminals for inputting/outputting signals may be positioned on the flexible circuit board or the rigid board, on which the LCD panel is seated.

The connectors 130 are commonly divided into male and female connectors 131 and 132. When female connectors 132 are mounted on the main board 110, male connectors 131 are formed at one end of the cables 125 with the same number as the female connectors 132 so that the cables 125 are connected to the main board 110.

However, the conventional liquid crystal imaging devices have a problem in that, since cables are used to connect the main board to the circuit board on which an LCD panel is seated, the connectors between the cables and the main board increase the thickness. This limits sliming portable communication terminals, for example.

SUMMARY OF THE INVENTION

Accordingly, the present invention has been made to solve the above-mentioned problems occurring in the prior art and provides additional advantages, by providing an LCD module applicable to a slim portable terminal (i.e. portable terminal having a small thickness), as well as a portable terminal using the same.

In accordance with one aspect of the present invention, there is provided an LCD module including an LCD panel; a circuit board on which the LCD panel is mounted; and a plurality of pogo pins electrically connected to the circuit board.

In accordance with another aspect of the present invention, there is provided a liquid crystal imaging means including an LCD module having a circuit board, an LCD panel seated on the circuit board, and a plurality of pogo pins electrically connected to the circuit board; and a main board having a plurality of contact members corresponding to the pogo pins so that the pogo pins are connected to respective contact members.

BRIEF DESCRIPTION OF THE DRAWINGS

The above and other exemplary features, aspects, and advantages of the present invention will be more apparent from the following detailed description taken in conjunction with the accompanying drawings, in which.

DETAILED DESCRIPTION OF THE EXEMPLARY EMBODIMENTS

Hereinafter, exemplary embodiments of the present invention will be described in detail with reference to the accompanying drawings. For the purposes of clarity and simplicity, a detailed description of known functions and configurations incorporated herein is omitted to avoid making the subject matter of the present invention unclear.

Figure 1:
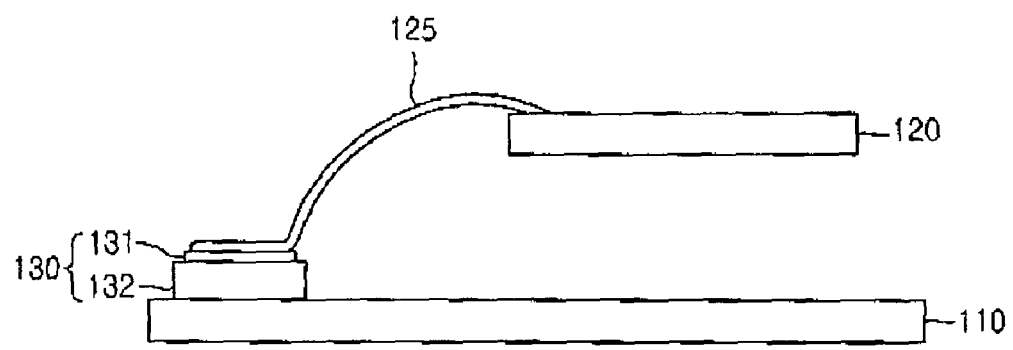
FIG. 1 shows the structure of a conventional liquid crystal imaging means having an LCD module and a main board connected to it.
Figure 2:
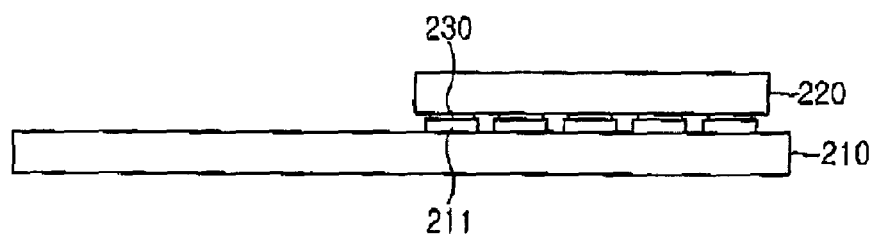
FIG. 2 shows the structure of a liquid crystal imaging means according to an embodiment of the present invention.

FIG. 2 shows the brief structure of a liquid crystal imaging means according to an embodiment of the present invention. As shown, the liquid crystal imaging means 200 according to an embodiment of the present invention includes an LCD module 220 and a main board 210.

Figure 3:
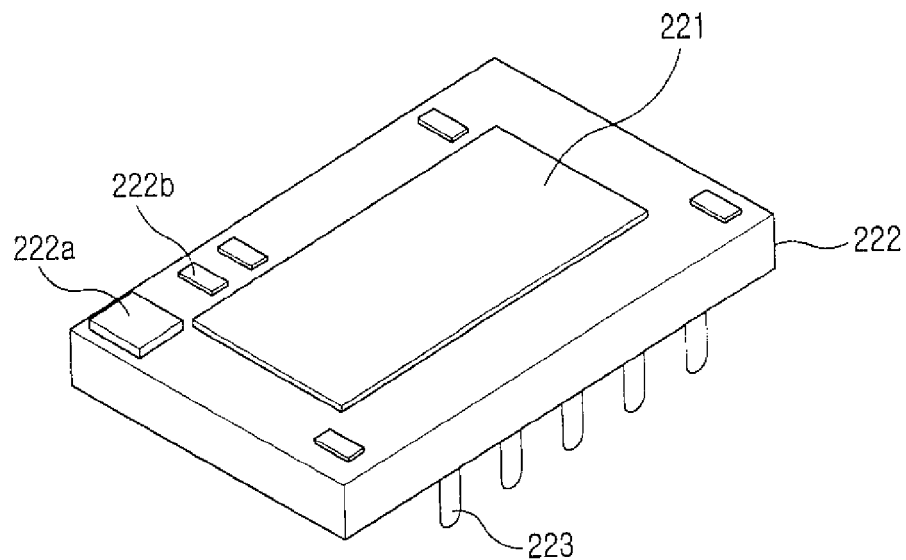
FIG. 3 separately shows an LCD module shown in FIG. 2.

FIG. 3 shows the LCD module shown in FIG. 2. As shown, the LCD module 220 includes an LCD panel 221, a circuit board 222 on which the LCD panel 221 is seated, and a plurality of pogo pins 223 electrically connected to the circuit board 222.

The circuit board 222 may be a flexible printed circuit board or a rigid printed circuit board. A driver 222a and a number of electronic components 222b may be integrated on the circuit board 222.

Figure 4:
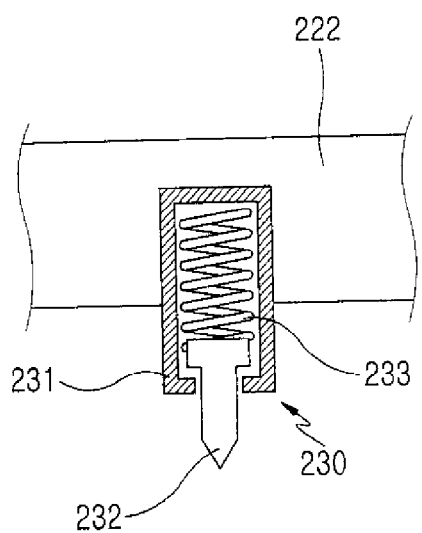
FIG. 4 magnifies a pogo pin portion of the LCD module shown in FIG. 3.

FIG. 4 magnifies a pogo pin portion of the LCD module shown in FIGS. 2 and 3. Referring to FIG. 4, each pogo pin 223 includes a housing 231 partially inserted into the circuit board, an elastic member 233 positioned inside the housing 231, and a pin 232.

The housing 231 is hollow and has an opening. The housing 231 may be made of a metallic material. The elastic member 233 may be a spring, for example, and provides the pin 232 with elasticity. The pin 232 has a head engaging with an end of the housing 231.

The main board 210 has contact members 211 formed on its upper surface so as to correspond to the pogo pins 230 one by one so that the pogo pins 230 are fixedly inserted therein. That it, the contact members 211 are positioned on the main board 210 so as to correspond to respective pogo pins 230, which are connected to the main board 210 via respective contact members 211.

Accordingly, the present invention directly connects the LCD module to the main board by pogo pins so that it can be applied to a slim liquid crystal imaging means.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A liquid crystal imaging means comprising:
   an LCD module having a circuit board, an LCD panel seated directly on an upper surface of the circuit board, a driver for driving the LCD panel and a number of electronic components being integrated directly on the upper surface of the circuit board, and a plurality of pogo pins electrically connected to the circuit board and being disposed directly on a lower surface of the circuit board; and
   a main board having a plurality of contact members corresponding to the plurality of pogo pins so that the plurality of pogo pins are fixedly inserted in and electrically connected to respective contact members.

2. The liquid crystal imaging means as claimed in claim 1, wherein the circuit board comprises a flexible printed circuit board or a rigid printed circuit board.

3. The liquid crystal imaging means as claimed in claim 1, wherein each pogo pin comprises:
   a housing being partially inserted into the lower surface of the circuit board;
   an elastic member mounted inside the housing; and
   a pin abutting an end of the elastic member while being partially interposed inside the housing.

4. A portable mobile terminal having the liquid crystal imaging means claimed in claim 1.

* * * * *